United States Patent [19]
Willson, Jr. et al.

[11] Patent Number: 5,479,363
[45] Date of Patent: Dec. 26, 1995

[54] PROGRAMMABLE DIGITAL SIGNAL PROCESSOR USING SWITCHABLE UNIT-DELAYS FOR OPTIMAL HARDWARE ALLOCATION

[75] Inventors: Alan N. Willson, Jr., Pasadena, Calif.; Kei Y. Khoo, Portland, Oreg.; Alan Kwentus, Torrance, Calif.

[73] Assignee: The Regents of the University of California, Oakland, Calif.

[21] Appl. No.: 55,975

[22] Filed: Apr. 30, 1993

[51] Int. Cl.⁶ .................................................... G06F 15/31
[52] U.S. Cl. .................................................... 364/724.16
[58] Field of Search ....................... 364/724.16, 724.13, 364/724.01, 724.1

[56] References Cited

U.S. PATENT DOCUMENTS

| | | | |
|---|---|---|---|
| 4,344,149 | 8/1982 | Van de Meeberg et al. | 364/724.1 |
| 4,698,680 | 10/1987 | Lewis, Jr. et al. | 358/166 |
| 4,709,343 | 11/1987 | Van Cang | 364/724.01 |
| 4,775,851 | 10/1988 | Borth | 341/155 |
| 5,117,385 | 5/1992 | Gee | 364/724.16 X |
| 5,223,653 | 6/1993 | Kunimoto et al. | 364/724.17 X |
| 5,243,552 | 9/1993 | Asakura | 364/724.16 X |

FOREIGN PATENT DOCUMENTS

| | | |
|---|---|---|
| 0266004 | 10/1987 | European Pat. Off. . |
| 2104332A | 8/1982 | United Kingdom . |

OTHER PUBLICATIONS

C. Golla, F. Nava, F. Cavallotti, A. Cremonesi, P. Piacentini, G. Casagrande, and G. Campardo, "A 30M samples/s programmable filter processor," *Proc. IEEE Int. Solid–State Circuits Conf.*, pp. 116–117, 1990.

M. Hatamian and S. K. Rao, "A 100MHz 40–tap programmable FIR filter chip," *Proc. Int. Symp. Circuits and Systems*, vol. 4, pp. 3053–3056, May 1–3, 1990.

J. B. Evans, Y. C. Lim, and B. Liu, "A high speed programmable digital FIR filter," *Proc. ICASSP–90*, vol. 2, pp. 969–971, Apr. 3–6, 1990.

H. Samueli, "An Improved Search Algorithm for the Design of Multiplierless FIR Filters with Powers–of–Two Coefficients," *IEEE Trans. Circuits Syst.*, vol. CAS–36, No. 7, pp. 1044–1047, Jul. 1989.

J. Laskowski, "A Silicon Compiler for Liner–Phase FIR Digital Filters," pp. 1–23 and 58–59, University of California, Los Angeles (Master's thesis), 1991.

*Primary Examiner*—Tan V. Mai
*Attorney, Agent, or Firm*—Loeb and Loeb

[57] ABSTRACT

A novel switchable unit-delay has been developed for the efficient implementation of programmable digital finite impulse response filters and correlators. A p-tap consisting of this novel switchable unit-delay and a two-non-zero-digit partial product generator and adder have been implemented. The combination of several p-taps, made possible by the switchable unit-delay, allows for the efficient implementation of coefficients with more than two non-zero digits. In a straightforward implementation of a programmable finite impulse response filter, many tap "multipliers" would significantly waste valuable computational resources since all filter taps would need to accommodate "difficult" coefficient values (i.e., many non-zero digits), while for any specific transfer function, most filter taps would not require such extreme capabilities. The switchable unit-delay not only allows the programing of the number of taps and the specific tap-coefficient values, it provides the capability for programing the optimal allocation of hardware resources to each filter tap.

10 Claims, 12 Drawing Sheets

PROGRAMMABLE DIGITAL SIGNAL PROCESSOR USING SWITCHABLE UNIT-DELAYS FOR OPTIMAL HARDWARE ALLOCATION

BACKGROUND OF THE INVENTION

1. Field of the Invention

This invention relates to the efficient implementation of multiply/accumulate/delay algorithms of the form $$y(n) = \sum_{k=0}^{N-1} h(k)x(n-k) \quad (1)$$

which are commonplace computations in the implementation of various digital signal processing systems, such as digital filters and correlators, and more particularly relates to efficient implementations of FIR digital filters using a canonic signed-digit approach.

2. Description of the Prior Art

Finite impulse response (FIR) filters have become common over the last fifteen years for performing digital filtering. Such digital filters, which may be implemented in dedicated hardware, or by digital signal processors or by microprocessors, implement a filtering algorithm comprised of multiplying the input or delayed elements of the input with coefficients and summing the products to obtain an output. By altering the coefficients, many different filtering characteristics can be obtained. For some applications, it is necessary to allow the user of the filter to alter these coefficients. Thus, such filters are best implemented by using some form of programmable structure.

Specialized circuits such as the DSP 56200 available from Motorola of Schaumburg, Ill., have been specifically designed for implementing FIR digital filtering algorithms at high speed with programmable hardware. Such filters commonly have one or more delay elements, one or more coefficient multipliers that multiply either the input or the output of the delay elements with coefficients, and one or more adders that sum the output of the coefficient multipliers. Each such structure is relatively simple. However, if a filter providing thirty or more taps or delay elements is implemented, providing thirty or more repetitions of each such delay and computational element, a large amount of area on a semiconductor die is required. Various high speed programmable digital filters are described in C. Golla, F. Nava, F. Cavallotti, A. Cremonesi, P. Piacentini, G. Casagrande, and G. Campardo, "A 30M samples/s programmable filter processor," *Proc. IEEE Int. Solid-State Circuits Conf.*, pp. 116–117, 1990; M. Hatamian and S. K. Rao, "A 100 MHz 40-tap programmable FIR filter chip," *Proc. Int. Symp. Circuits and Systems*, vol. 4, pp. 3053–6, May 1–3, 1990; and J. B. Evans, Y. C. Lim, and B. Liu, "A high speed programmable digital FIR filter," *Proc. ICASSP*-90, vol. 2, pp. 969–71, Apr. 3–6, 1990. These articles describe complex circuits having maximum data sample rates up to 100 Megahertz.

Frequently, to save space on a die, various components such as the adder and the multipliers may be shared in a time multiplexing manner. However, such multiplexing slows down the processing speed of the filter, resulting in a lower maximum data sample rate for the filter. The Motorola DSP 56200 is an example of such a chip as it uses a single multiplier. Due to the sharing of the multiplier, the Motorola DSP 56200 typically cannot process signals having high data sample rates. Typically, such circuits are used for much lower data sample rates such as below 1 MHz.

It has been known for a long time that finite impulse response filter coefficients can be implemented through the use of canonic signed-digits (CSD). Canonic signed-digits are described in, among other sources, H. Samueli, "An improved search algorithm for the design of multiplierless FIR filters with powers-of-two coefficients," *IEEE Trans Circuits Syst.*, vol. CAS-36, pp. 1044–1047, July 1989.

The advantages of CSD may be seen as follows. It is well known that a signed-digit representation of a fractional number x can be written as:

$$x = \sum_{k=0}^{M} S_k 2^{-k} \quad (2)$$

or $$x = S_0 2^0 + S_1 2^{-1} + \ldots + S_M 2^{-M}$$

where $S_k$ is an element of the set $\{-1,0,+1\}$. In the above equation, x has a word length of M+1 digits. The number of non-zero terms (i.e., where $S_k$ is not equal to 0) in x is the number of non-zero digits.

In general, there are several different signed-digit representations for a given number x. A minimal representation is one that requires the least number of non-zero digits. There may be more than one minimal representation for any given number X.

A canonic signed-digit (CSD) representation for a number is defined as the minimal representation for which no two non-zero digits $S_k$ are adjacent. The advantage of minimal signed-digit representation such as the CSD representation is that there are fewer non-zero terms in the equation. By having fewer non-zero terms, less hardware is needed in a physical implementation to represent the number.

It is easy to convert a binary number to CSD representation. For example, the number x=0.011111 (in binary) can also be represented by a signed-digit number as:

$$x = 0.10000\bar{1}$$

where $\bar{1}$ represents a minus 1. Note that this CSD representation of x has fewer non-zero digits than the original representation of x; i.e., two non-zero values instead of five non-zero values in the original representation. To see that this is the same number as x, we can separate out the negative digit and subtract it from the positive digits:

$$\begin{array}{r} ^{11}\ 0.100000 \\ -\ 0.000001 \\ \hline 0.011111 \end{array}$$

to get the original representation of x. One advantage of a CSD representation is that it simplifies multiplication.

Whatever the means used to represent multiplier coefficient digits (e.g., decimal, BCD, binary, signed-digit, etc.), the multiplication operation is easily defined as simply a sequence of addition operations where the various partial products are added, with each partial product being computed by multiplying a multiplier coefficient digit by the multiplicand data and then performing an appropriate shift. In a general programmable multiplier, there must be hardware available to accomplish a multiplication and shift operation to generate a partial product for each multiplier digit.

A multiplier digit that might have the value zero is one that would generate a zero partial product. Therefore, unless it was known in advance where the zero multiplier digits were located, the hardware to generate the partial products would still be present, if programmable general-purpose multipliers are employed, even though no such partial products would need to be generated. An advantage of a minimal signed-digit multiplier coefficient representation, in particular CSD, is that it guarantees a certain minimum number of zero digits.

Algorithms for computing CSD coefficients in FIR filters that meet arbitrary specifications have been developed, as in H. Samueli, "An improved search algorithm for the design of multiplierless FIR filters with powers-of-two coefficients," IEEE *Trans. Circuits Syst.*, vol. CAS-36, pp. 1044–1047, July 1989, for example.

As mentioned previously, a drawback of using such CSD coefficients in programmable filters is that they may still lead to severe hardware inefficiencies. In a digital FIR filter, which is most commonly structured in the direct configuration shown in FIG. 1(a) and the transposed configuration shown in FIG. 1(b), the input data samples x(n) are delayed by a string of one unit delays $z^{-1}$ and processed by an array of multipliers $C_k$, k=0, ..., N–1 followed by adders $1_0$ through $1_{N-1}$. These multipliers are often called "taps" and the multiplier coefficients $C_k$ are often called tap coefficients. Examples of individual stages or filter taps are shown in FIGS. 2(a) and 2(b) for filters of FIGS. 1(a) and 1(b), respectively. Each multiplier and adder is typically a full hardware implementation of the arithmetical function for performing computations on a full input data word. The multiplier coefficient hardware typically has the same number of bits of precision for each tap as will be required for the most precise coefficient that will be used when the filter is programmed.

While we have referred to FIGS. 1(a) and 1(b) as an FIR filter, it should be noted (and is well known) that the same structures can implement the well-known correlation operation. Moreover, by appropriately interconnecting such structures, it is possible to implement a wide variety of DSP systems. For example, an interconnection of two FIR filter blocks is shown in FIG. 1(c) which, aside from a single pipeline delay of one input, implements the second-order Infinite Impulse Response (IIR) filter shown in FIG. 1(d).

In a straightforward programmable implementation of an FIR filter, whether or not CSD coefficients are used, many filter-tap multipliers would significantly waste valuable computational resources. All multiplier taps of a programmable structure would need to accommodate "difficult" coefficient values, that is, coefficients requiring relatively many non-zero digits. Yet in actual implementations, for a typical specific filter algorithm, most taps would not require such extreme capabilities. For example, the coefficient values that require more non-zero digits are often only those near the center of the FIG. 1(a) or FIG. 1(b) tap array of a typical lowpass FIR filter. Therefore, CSD has not apparently been used in a programmable digital filter because the lack of knowledge about where difficult (many non-zero digits) coefficients might appear results in a large percentage of wasted hardware for virtually any filter algorithm.

SUMMARY OF THE INVENTION

Since programmable FIR filter blocks are extremely useful in the design of various DSP systems a major objective of this invention is to implement an FIR filter in a manner in which the filter's available tap-coefficient multiplier hardware can be efficiently allocated, at the time the device is programmed for a specific filter implementation, such that just the minimum hardware that is required by each tap is employed at that tap. Our invention achieves this goal for filters implemented either using the direct form of a filter tap as shown in FIG. 2(a) or in the transposed form shown in FIG. 2(b). In an embodiment of the invention, each of the filter taps is formed by a cascade of substructures called p-taps having an arbitrary precision of typically one or two signed digits. It is a major aspect of an embodiment of the invention that each cascade of p-taps can be structured via programming to provide an optimal amount of hardware at each tap for implementing the desired full multiplier tap coefficient value having the desired precision. This is achieved by arranging for the adjacent p-taps to be separated by one or more delay registers that can be individually bypassed. This bypass is preferably implemented through the use of a single transistor. By using p-taps this way, computational resources that otherwise might have been wasted for many taps are made available to further increase the precision in any filter tap's coefficient representation, or for use in implementing a larger number of filter taps.

Each p-tap provides the hardware to generate one, or a small number of partial products, and also provides the necessary shift and add hardware for those partial products. The interconnection of adjacent p-taps provides the means for computing the complete tap coefficient multiplication at the desired precision.

In our preferred embodiment we employ p-taps that generate two partial products. We use a signed-digit representation for the multiplier coefficients, and each digit can take on one of the two values plus or minus one. This avoids requiring the multipliers to have hardware to zero out a partial product when a digit in a coefficient is zero.

DETAILED DESCRIPTION OF THE INVENTION

The preferred embodiment allows the programming of the number of filter taps and the specific filter-tap coefficient values. The embodiment also provides the capability for programming the optimal allocation of hardware resources to each filter tap. Thus the computational resources that otherwise might have been wasted are made available to further increase the precision in any tap's coefficient representation, or for use in implementing a larger number of filter taps.

Figure 1A:
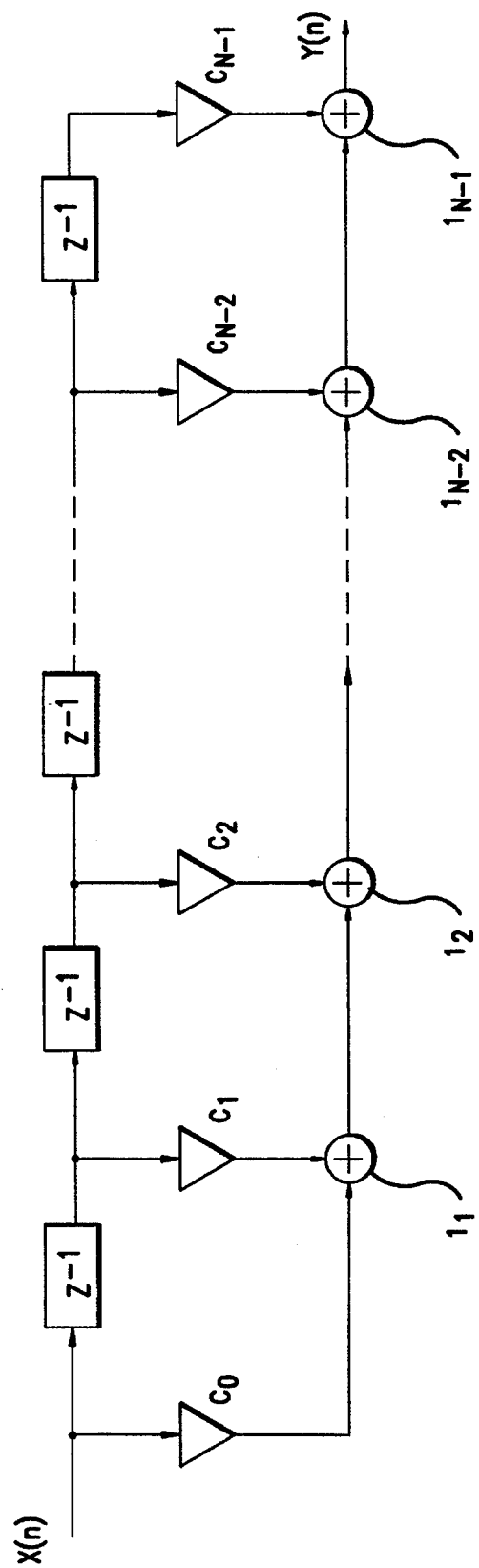
FIGS. 1(a) through 1(d) are exemplars of prior art filter structures.
Figure 1B:
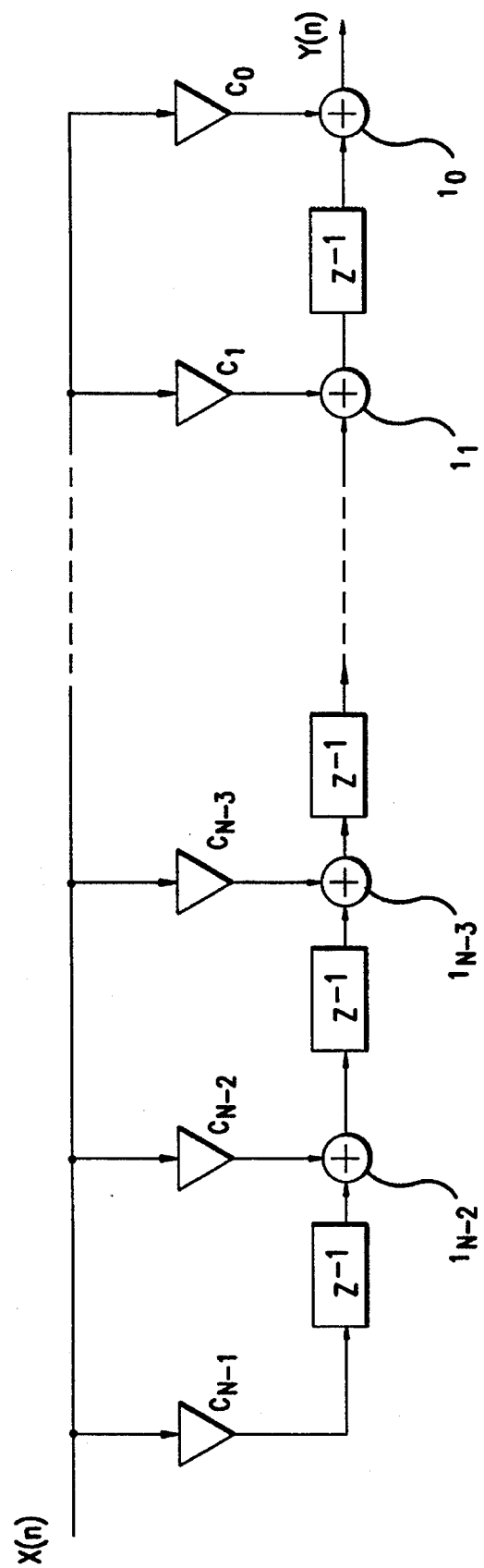
Figure 1C:
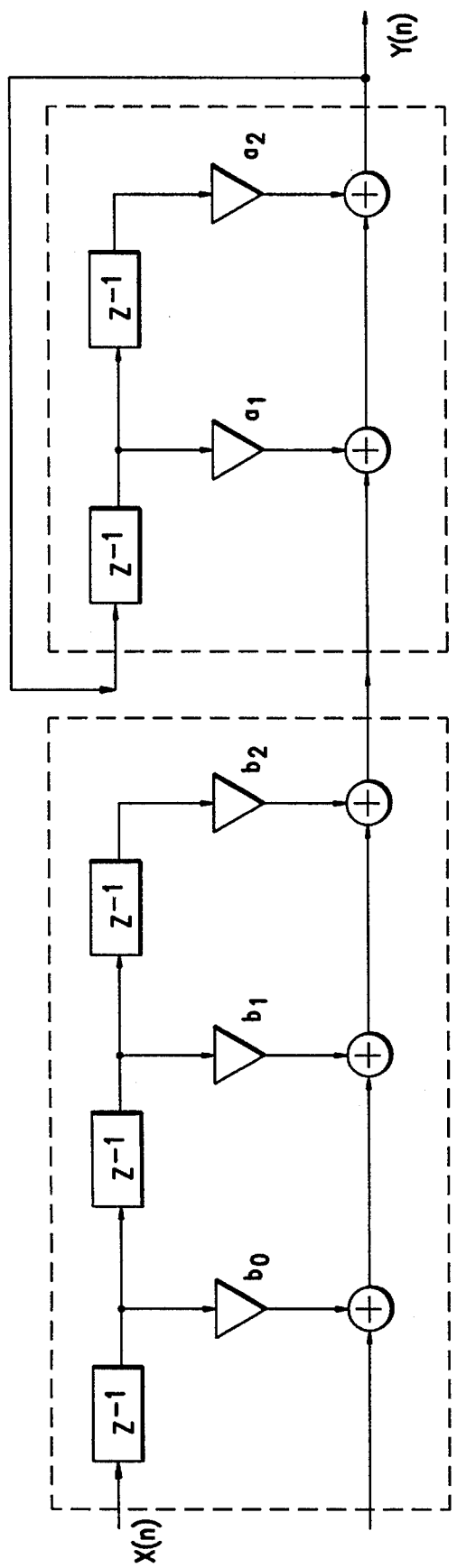
Figure 1D:
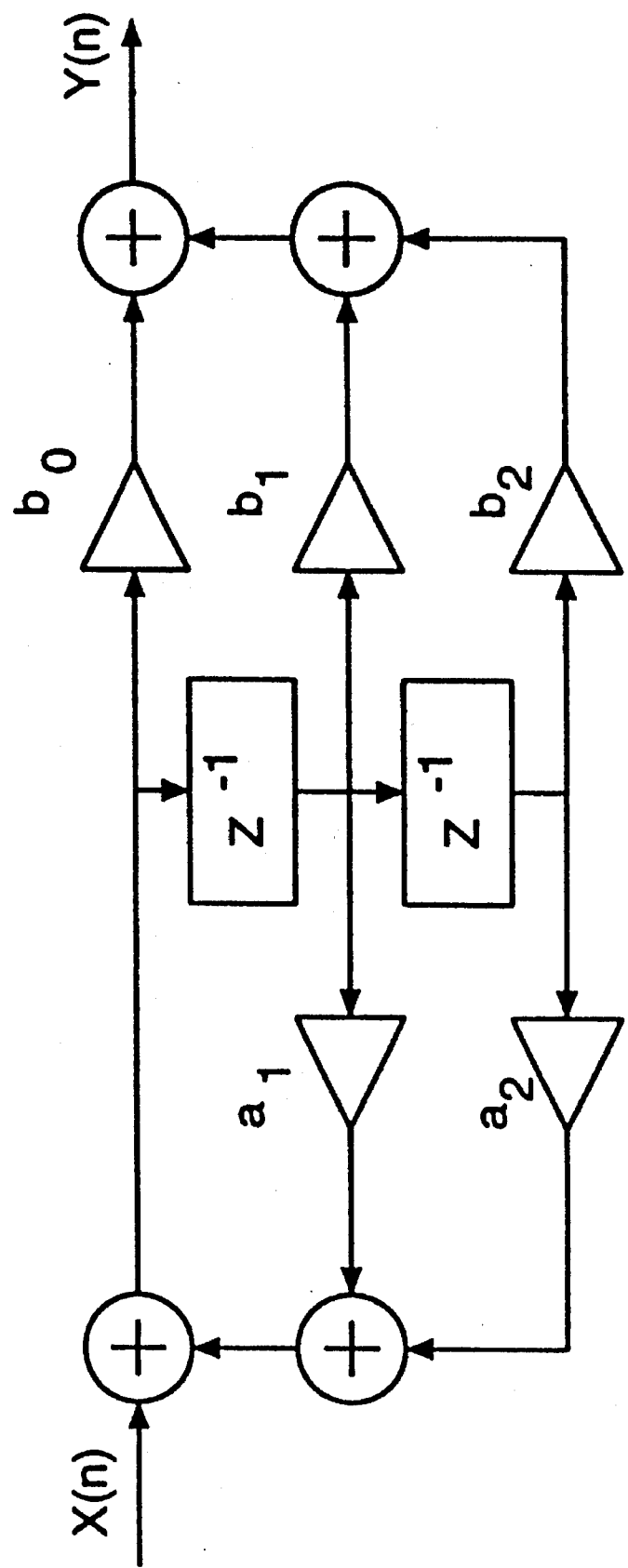
Figure 2A:
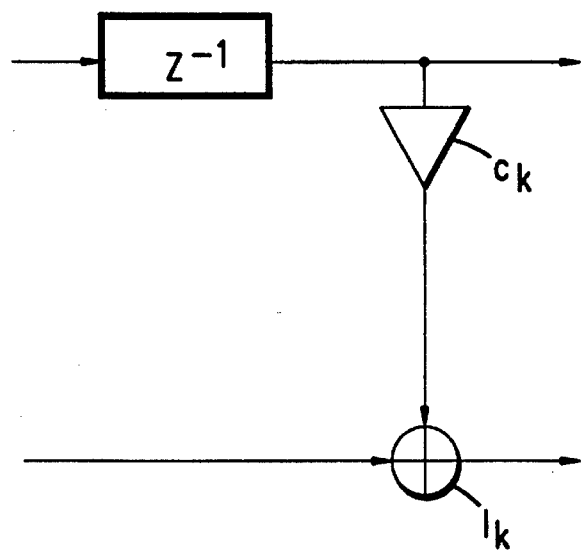
FIGS. 2(a) and 2(b) are exemplars of prior art full precision filter taps for implementing the filters shown in FIGS. 1(a) and 1(b), respectively.
Figure 2B:
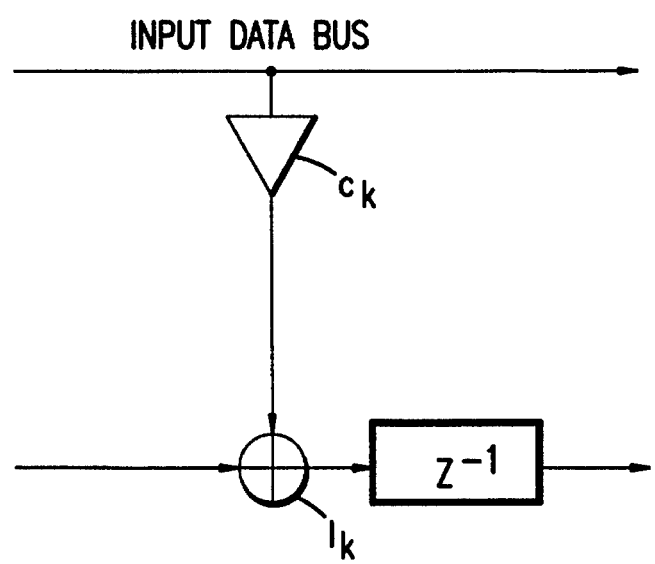
Figure 3A:
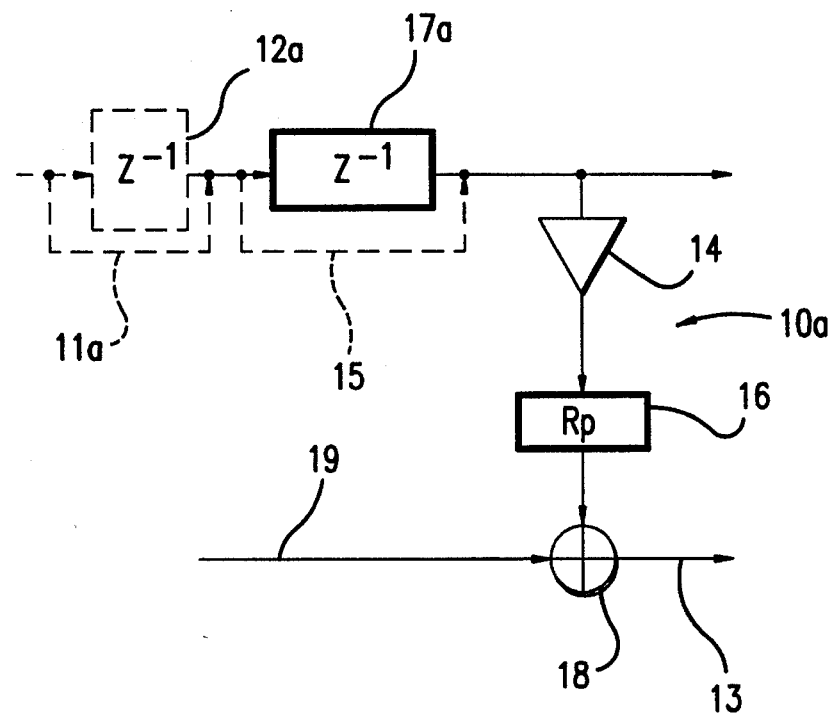
FIGS. 3(a) and 3(b) are block diagrams of an N digit p-tap element made according to the invention for implementing the full precision taps of FIGS. 2(a) and 2(b), respectively.
Figure 3B:
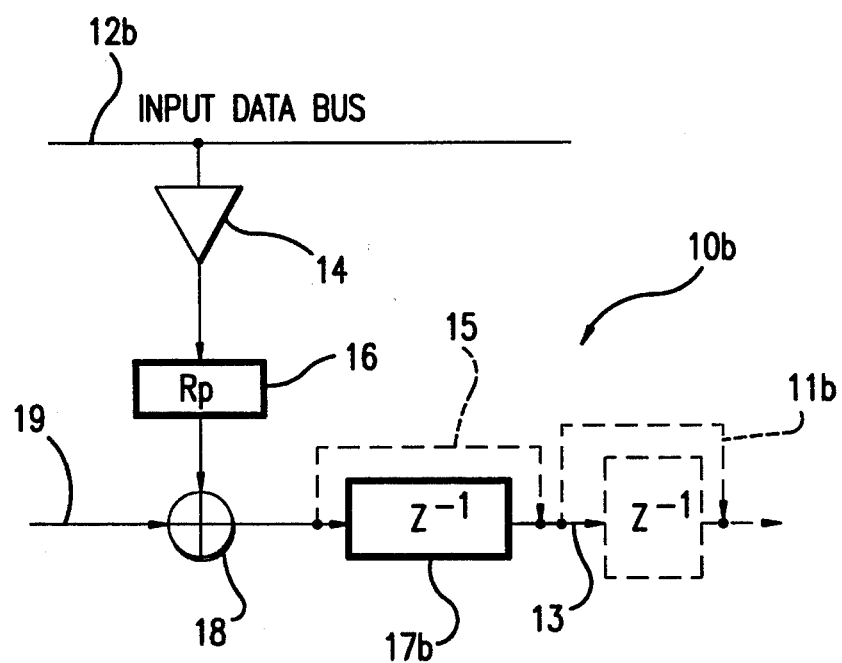

To achieve these advantages a novel p-tap element 10 is shown in FIGS. 3(a) and 3(b) for forming the full precision filter taps of FIGS. 2(a) and 2(b), respectively. The p-tap element 10a or 10b is coupled to an input data bus 12a and 12b and includes a coefficient multiplier 14, a pipeline register 16, an adder 18, a prior stage input 19, a unit delay element 17a and 17b, which may be bypassed by a bypass 15, and an output 13. Pipeline register 16 is optional and is used in the preferred embodiment to increase the maximum data sample rate. Also, optional bypassable stages of delay 11a or 11b may be added to readily implement halfband filters. Still further, the delay elements 17 and bypass 15 may be replaced with a controllable switching element so a p-tap may be used for matrix manipulation and scalar multiplication.

Figure 8:
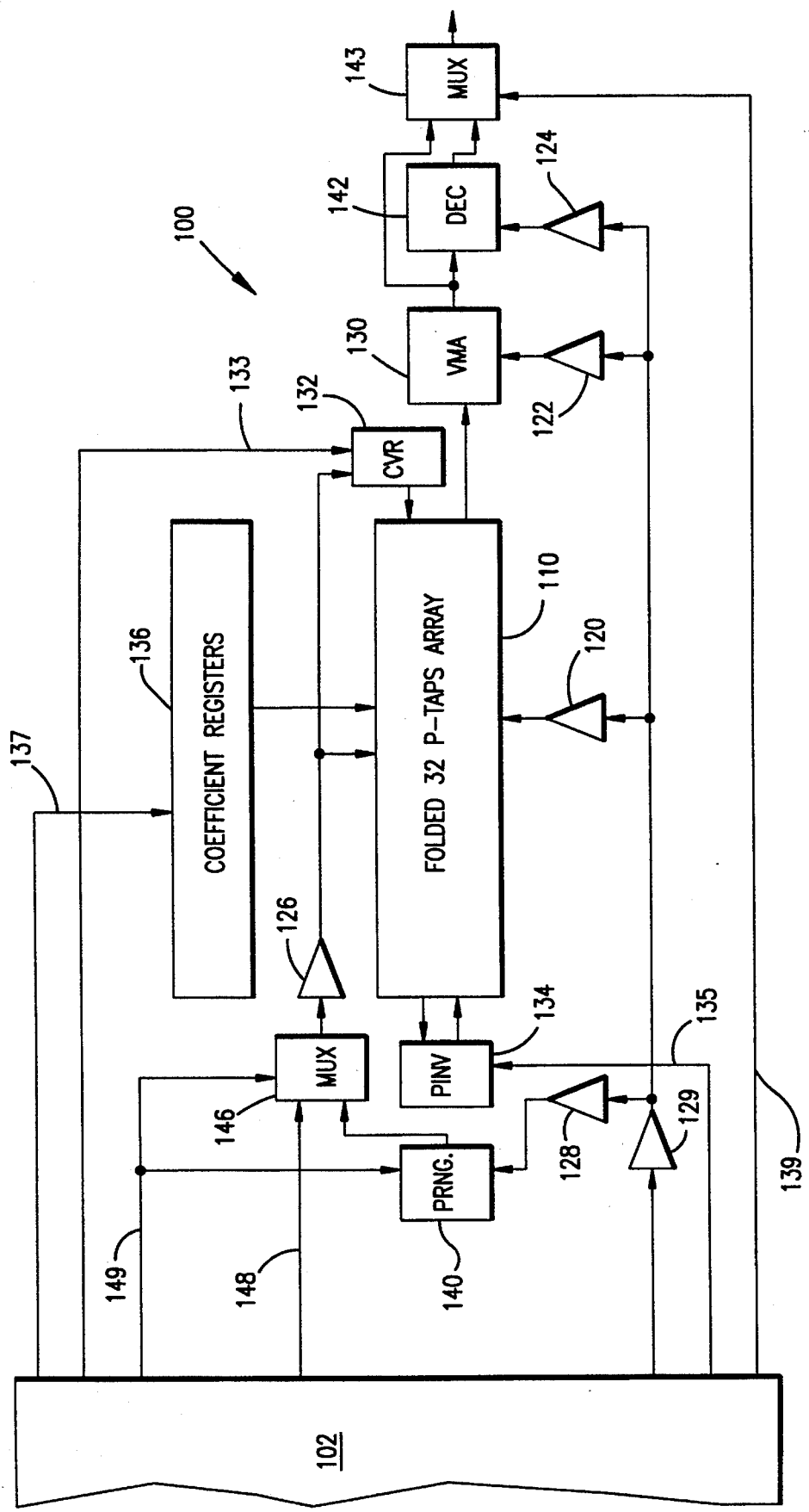
FIG. 8 is a block diagram of a programmable FIR filter using the p-taps of FIG. 3.

The unit-delay action of the switchable unit-delay element can be programmed at the same time the coefficient values are programmed and stored in the coefficient register 136 of FIG. 8 to be either turned off (bypassed) or turned on (not bypassed). In the preferred embodiment, all programming is carried out by an external controller 102 shown in FIG. 8.

Figure 4:
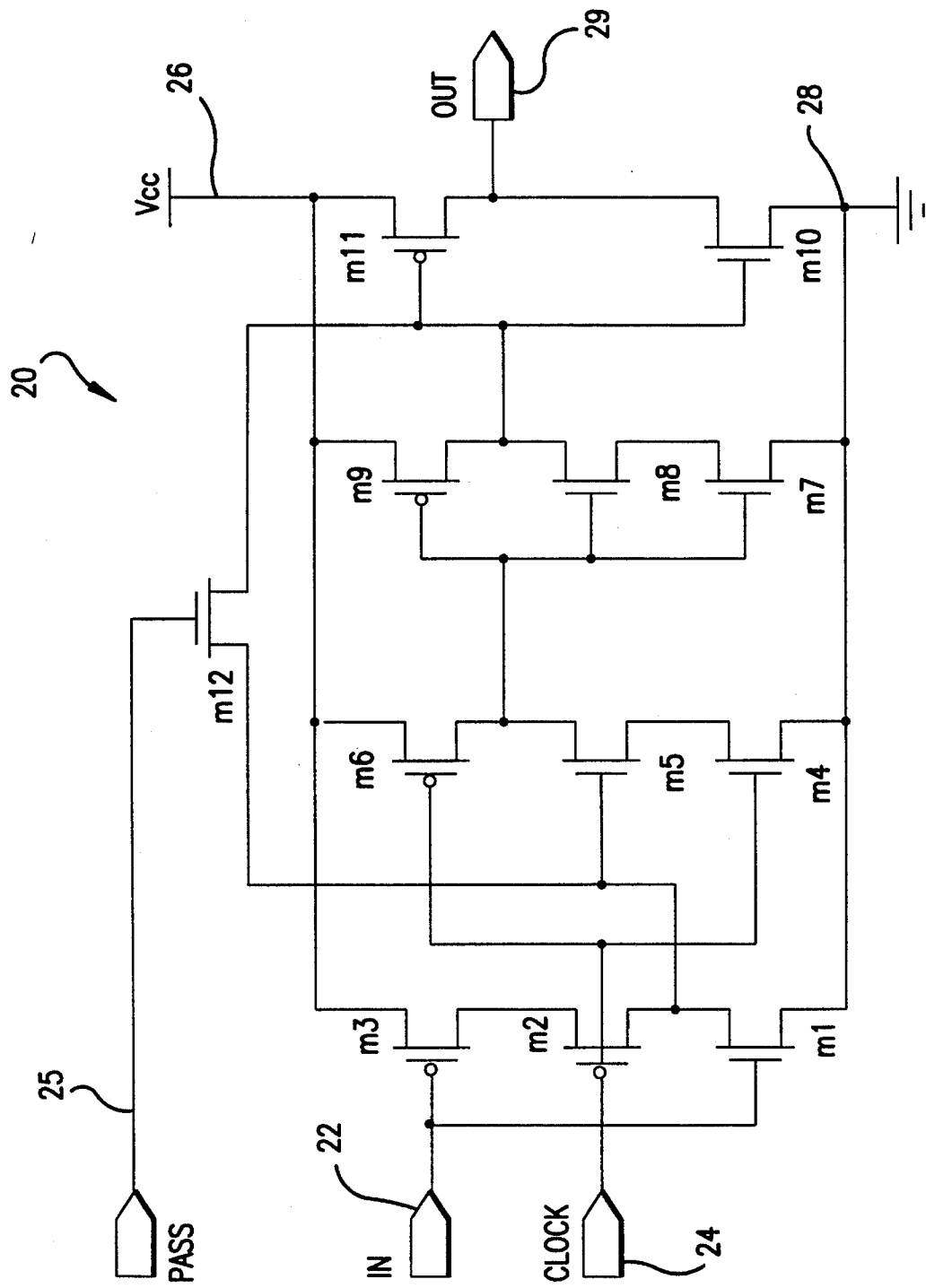
FIG. 4 is a schematic of a CMOS implementation of the delay unit shown in FIGS. 3(a) and 3(b).

FIG. 4 shows the preferred construction of the switchable unit delay 17a or 17b of FIG. 3 including the bypass 15. In CMOS technology the preferred circuit 20 of the unit-delay 17 is based on the true single phase latch as is described in J. Yuan and C. Svensson, "High-speed CMOS circuit technique," *IEEE Journal of Solid-State Circuits, vol. SC-24*, pp. 62–69, Feb. 1989, which is incorporated herein by reference. The basic latch comprises transistors m1–m11 and has a data input 22, a clock input 24, a voltage supply $V_{cc}$ 26, a ground 28 and an output 29. A bypass electrode "pass" 25 operating in response to a controller 102 provides such a control signal pursuant to the selected filter algorithm to control the bypass transistor m12. With the addition of a single transistor m12, the unit-delay becomes switchable. When the transistor m12 is turned on, the circuit 20 no longer operates as a clocked latch and the input is routed directly to the output 29 (except for the switching delays of transistors m1, m2, m3, m11 and m10). When "pass" 25 is low, the leading edge of the clock latches the data at "in" 22 and the unit delay is said to be "on". This is the normal unit-delay operation. When "pass" is high and "clock" is low, m12 passes the input data to the output, bypassing transistors m4 through m9, and thus disabling the unit-delay action, In this latter state, the unit delay is said to be "off".

In the preferred embodiment, the coefficient multiplier 14 is a two signed-digit multiplier that is preloaded (programmed) by the controller 102 according to the filter algorithm, with a two digit representation. In the preferred embodiment, the coefficient may be represented by the following:

$$C = c_0 2^{-p_0} + c_1 2^{-p_1} \quad (3)$$

where $c_0$ and $c_1$ are the signed-digits, either 1 or $\bar{1}$ (i.e., $-1$), and $p_0$ and $p_1$ may vary from zero to fifteen. This provides an effective filter coefficient of sixteen bits. If the coefficient c is 0, then the coefficient is represented as follows:

$$0 = (1)2^{-p_k} + (\bar{1})2^{-p_k} \quad (4)$$

where the coefficients $p_k$ are the same arbitrary quantity.

Still further, if the coefficient C for the multiplier 14 only requires one non-zero digit $c_k$, then that one digit number is expanded into a two-non-zero-digit equivalent using one of the following two representations:

$$c_k 2^{-p_k} = c_k 2^{-(p_k+1)} + c_k 2^{-(p_k+1)}, \text{ where } p_k < 15 \quad (5)$$

$$c_k 2^{-p_k} = c_k 2^{-(p_k-1)} - c_k 2^{-p_k}, \text{ where } p_k < 0 \quad (6)$$

The choice between the representations in Equations 5 and 6 is generally arbitrary except where $p_k = 0$, in which case Equation 5 must be used, and where $p_k = 15$, in which case Equation 6 must be used.

By the selection of the two digit, non-zero representation for a zero coefficient and the selection of an appropriate two digit non-zero representation of a one non-zero digit coefficient, it is possible to represent any coefficient with the numbers $-1$ and $1$ rather than with $-1$, $0$, and $1$ as used in standard CSD representations. This elimination of a zero quantity simplifies the construction of the multiplication hardware. Furthermore, it avoids the necessity of designing and implementing hardware capable of storing and processing any of three values $\{-1, 0, +1\}$. Since 0 is not used, the more conventional storage and logic circuits can be used, with the only difference being that their binary states normally representing 0 and 1 now represent 1 and $-1$ or vice versa. In particular, this allows one control line to control the sign of the output in the multiplier instead of two or more as in the prior art.

Figure 5:
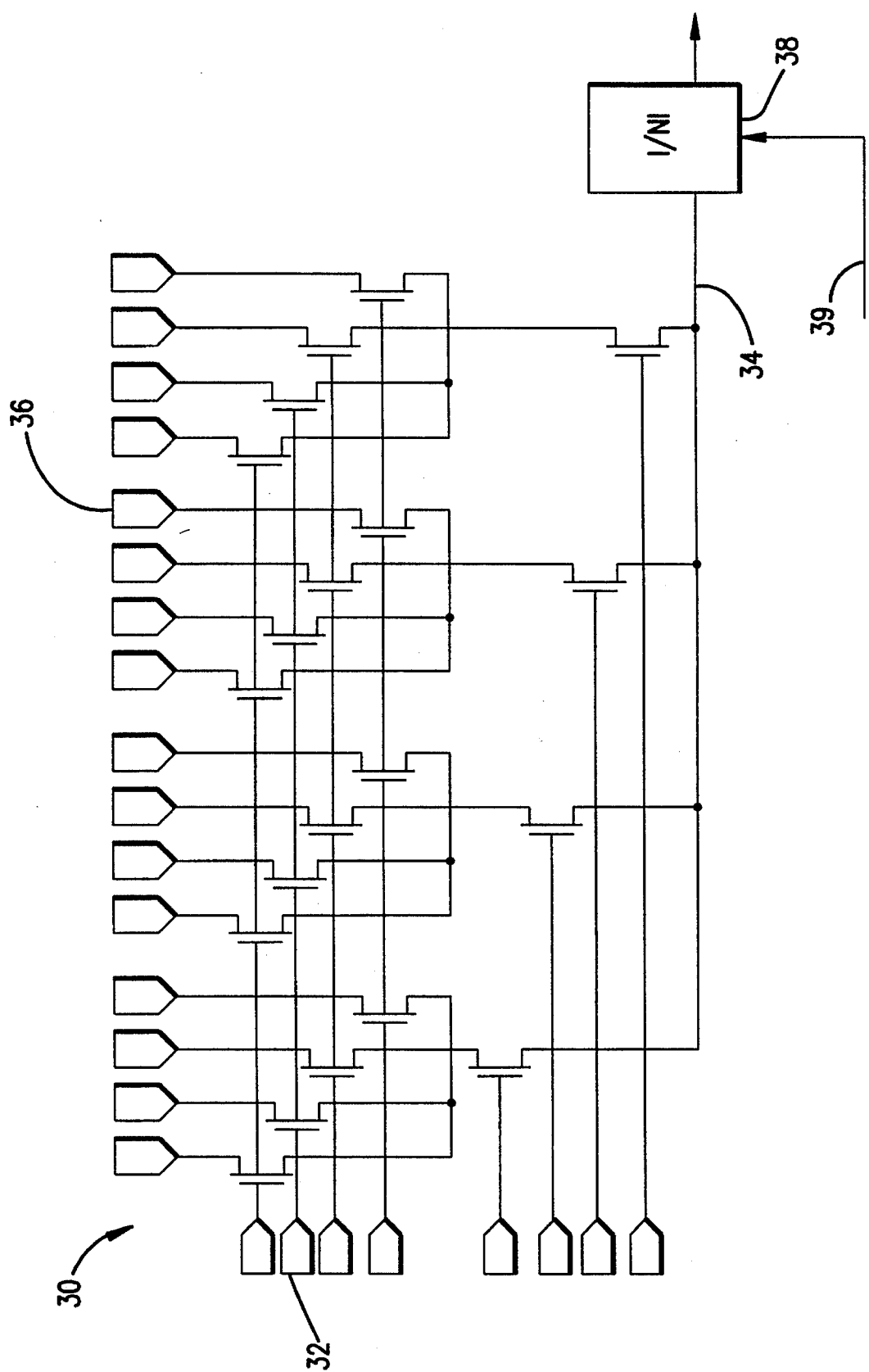
FIG. 5 is a schematic of a CMOS implementation of a multiplexer that may be used in the multiplier shown in FIG. 3.

The $2^{-p_k}$ shifting for one digit of a coefficient is realized in the preferred embodiment by selecting one of sixteen hardwired preshifted data 36 via two levels of 4-to-1 NMOS transmission gate multiplexers 30 shown in FIG. 5. The advantage of the two-level multiplexing is the reduction in the number of control lines 32 coupled to a coefficient register 136 (FIG. 8) from sixteen to eight. To save silicon area, each block of hardwired preshift is shared by four sets of multiplexers (or 2 p-taps, since each p-tap has two coefficient digits).

Since there is no zero coefficient digit, coefficient multiplication for each digit is either inverted or not inverted by an invert/no-invert circuit 38 coupled to the output 34 of the multiplexer. This may be readily done by a single control line 39 responding to the sign digit to provide a sign on the product. The serial output of the invert/no-invert circuit 38 is shifted into the pipeline register to form a parallel word. This forms the one's complement of the shifted data for the case of a negative coefficient digit (i.e., $\bar{1}$). As described below, the least significant bit of one that needs to be added to correctly form the two's complement negation is included in the compensation vector which is programmed by an external controller 102 as described below.

Due to the considerable delay incurred by the long input data bus and the two-level transmission gate multiplexer, a pipeline register 16 as shown in FIGS. 3(a) and 3(b) is inserted after the coefficient multiplier. This provides a higher maximum operating data sample rate.

Figure 6:
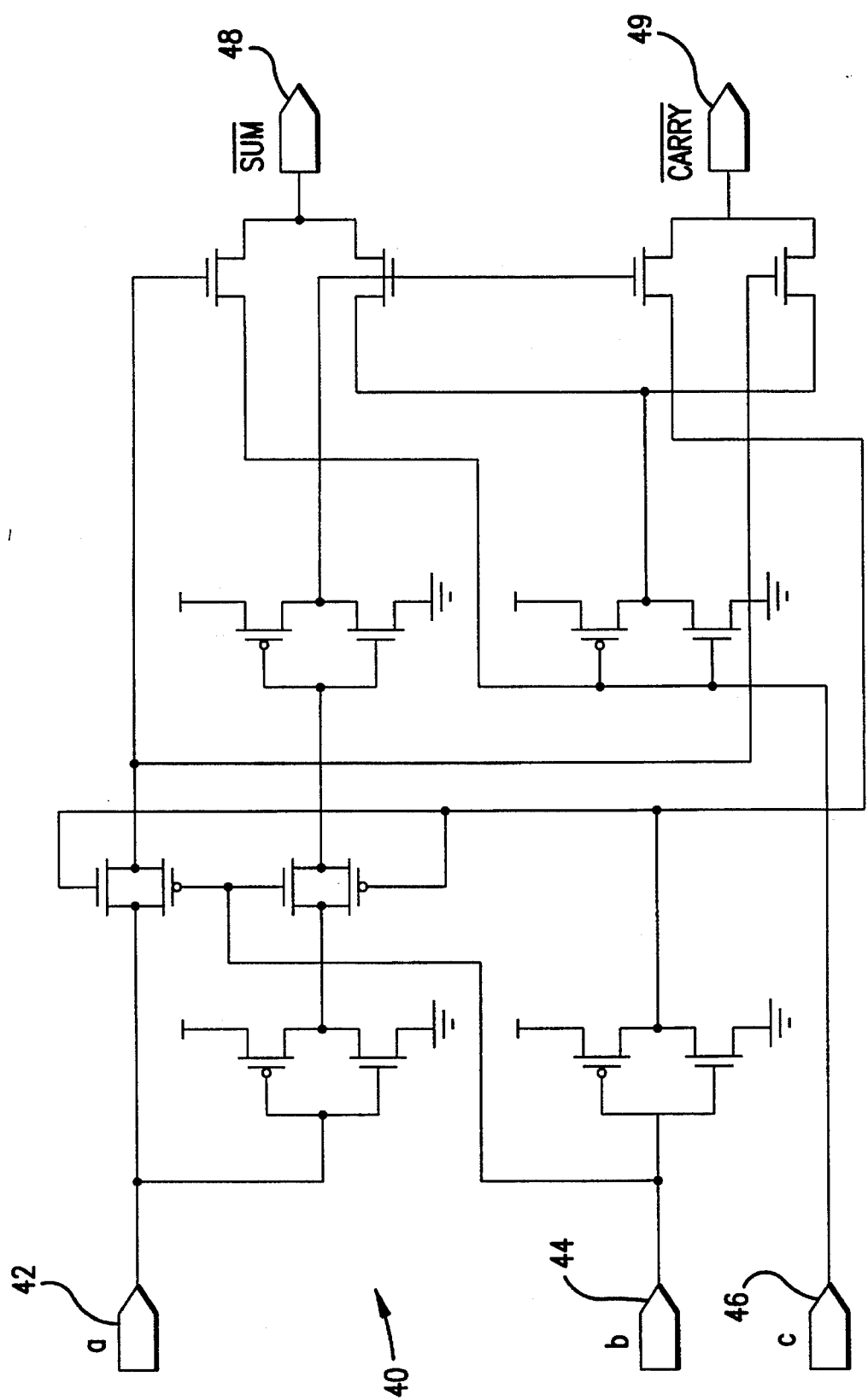
FIG. 6 is a schematic of a CMOS implementation of part of the adder shown in FIGS. 3(a) and 3(b).

To further enhance speed, carry-save adders are used for the summation node 18 in the p-tap, which avoids the carry-ripple delay. Two full adders in cascade are necessary to add up the two coefficient digit inputs and the sum and carry digits from the previous p-tap. In the preferred embodiment, the adders are implemented with CMOS transmission gates as a single bit adder 40 shown in FIG. 6. This full adder has two single bit inputs 42 and 44 and a carry input 46 and provides the sum 48 and carry 49 outputs.

Figure 7:
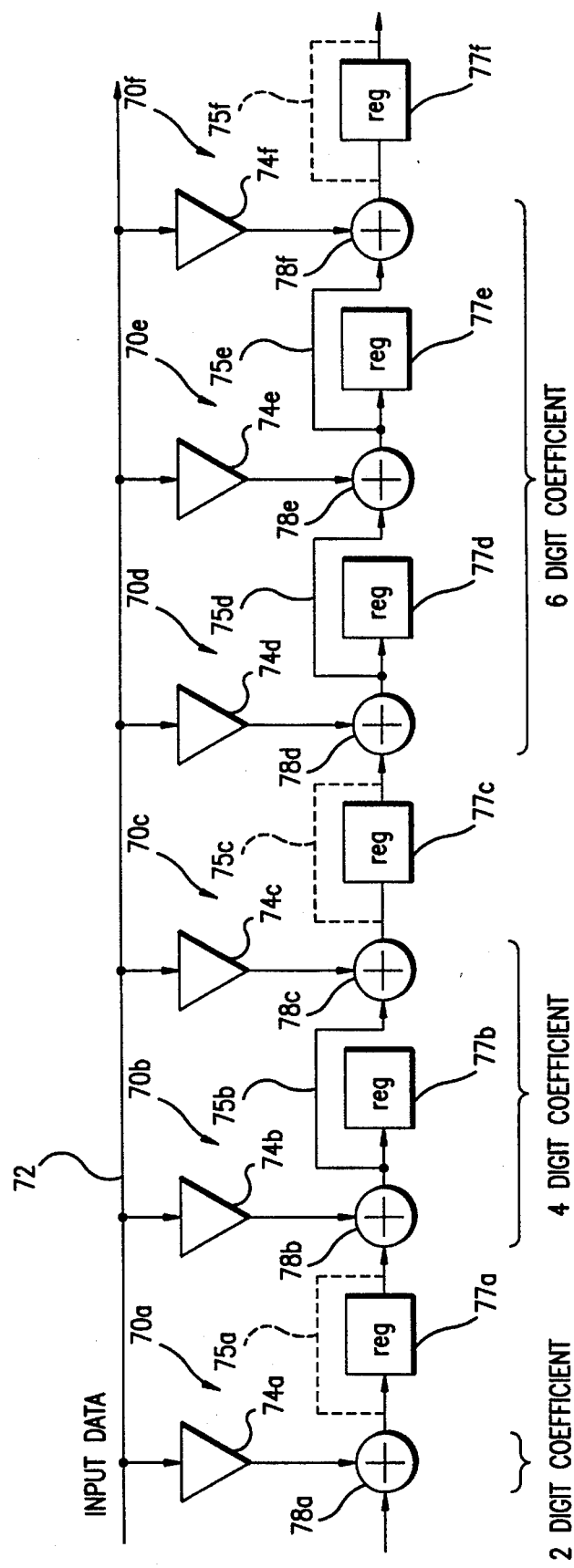
FIG. 7 is a block diagram showing how a two digit p-tap element, such as the ones shown in FIG. 3, may be combined to form larger digit-multiplier tap coefficients.

The construction of the p-tap 10a and 10b of FIGS. 3(*a*) and 3(*b*) allows for a maximum of flexibility and each p-tap 10b is coupled to the next p-tap as shown by p-taps 70a through 70f in FIG. 7. (For the purpose of clarity the pipeline registers 16 have been omitted.) Where the unit delay is not bypassed (i.e., such that the p-tap is acting as a normal tap), a dotted line 75 appears. Where one of the unit delay elements 77 in FIG. 7 has been bypassed, a solid line 75 appears.

By combining p-tap 10 filter elements, it is possible to build coefficient representations having more non-zero signed-digits than the basic p-tap 10 has. When a p-tap's unit-delay is off or bypassed, its summation node is connected immediately to the node of the next p-tap, merging the signed coefficient digits for the current p-tap and the next p-tap into a single filter coefficient of greater precision. If the unit-delay of the next p-tap is on, then the current p-tap together with the next p-tap effectively forms a single filter tap that has double the number of non-zero coefficient signed digits as that of a single p-tap. For example, if each of the p-taps in FIG. 7 has a two-digit signed coefficient multiplier, p-tap 70b and 70c combine to form a four-digit coefficient multiplier.

More non-zero coefficient digits can be included in any multiplier tap by combining additional p-taps in this manner. For example, if in p-taps 70d and 70e, the unit delays 77d and 77e are off (i.e., bypassed), p-taps 70d through 70f combine to yield a tap multiplier having a coefficient with six non-zero signed digits of precision.

Therefore, this approach permits efficient allocation of hardware resources to each filter tap while still preserving the ability to realize filters of high stopband attenuation (i.e., filters requiring some taps to have many non-zero digits). It has been observed in H. Samueli, "An improved search algorithm for the design of multiplierless FIR filters with powers-of-two coefficients," *IEEE Trans. Circuits Syst.*, vol. CAS-36, pp. 1044–1047, July 1989, that one non-zero digit in the CSD representation is typically required for each 20 dB of stopband attenuation in the filter specification, with an additional non-zero digit allocated to those filter tap coefficients whose magnitude exceeds one-half.

It can be seen that the throughput rate of the filter depends on the maximum number of adder stages between unit-delays in the p-taps. The delay of the critical path of the filter tap with the largest number of merged p-taps can be calculated as follows:

$$T_{total} = Kt_{adder} + (K-1)t_{unit\text{-}delay(off)} + t_{unit\text{-}delay(on)} \quad (7)$$

where $T_{total}$ is the total delay in a multi-p-tap filter tap;
K is the total number of p-tap elements 10 in the filter tap;
$t_{adder}$ is the propagation delay of the adder 18;
$t_{unit\text{-}delay(off)}$ is the delay through a unit delay 17 that has been turned off (i.e., by-passed 15); and
$t_{unit\text{-}delay(on)}$ is the sum of the output delay and the input setup time of a unit-delay 17 that is turned on.

The throughput rate of any filter implemented using this invention can be increased to the maximum rate dictated by a single p-tap element, that is to the rate specified by Equation 7 with K=1. To increase throughput, one provides multiple copies of a filter, connected in parallel, to form parallel filters with adders summing their outputs. Each filter tap can thus have its component p-taps distributed across the taps of the parallel filters such that no tap requires more than one p-tap.

For example, the filter of FIG. 7, where the largest coefficient requires three p-taps, can be readily implemented with three parallel p-tap filters whose outputs are summed. In the first of the parallel filters, the two-digit coefficient is assigned to the first p-tap element and two-digit portions of the four-digit and the six-digit coefficients are assigned to the second and third p-taps, respectively, of the first filter. In the second parallel filter, the first p-tap has a zero coefficient and the remaining two-digit portion of the four-digit coefficient and a second two-digit portion of the six-digit coefficient are assigned, respectively, to a second and third p-tap. For the third parallel filter, the first two p-taps have zero coefficients and the last p-tap has the remaining two-digit coefficient portion of the six-digit coefficient. Further, by including a control gate in a manner similar to programmable gate arrays the same filter array may be controlled by a controller to implement either the series filter implementation of FIG. 7 or the parallel approach providing higher speed.

A block diagram of a programmable linear-phase FIR integrated circuit 100, which is adapted for efficiently implementing linear phase filter algorithms is shown in FIG. 8. The filter 100 has sixteen-bit input and output data words with a twenty-bit internal word length.

Figure 9B:
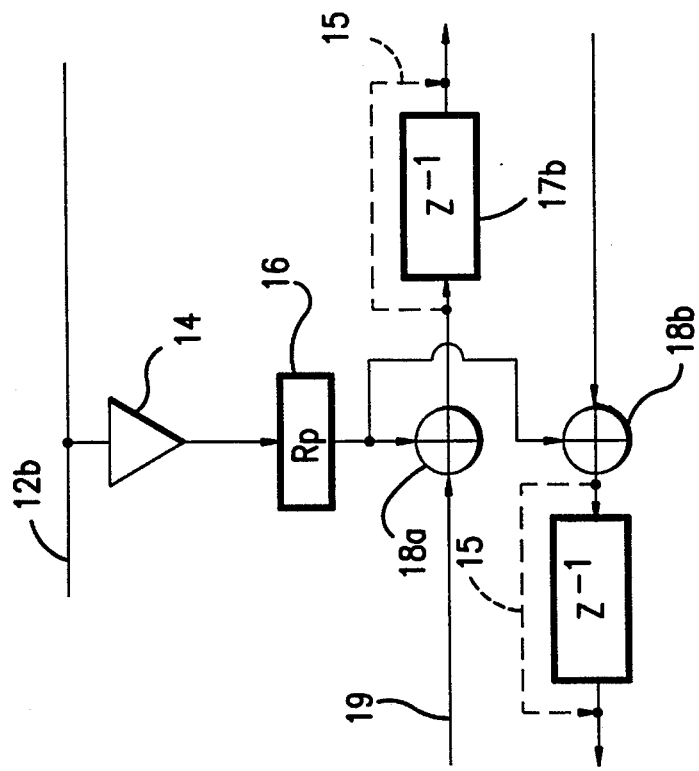
FIG. 9(b) is a block diagram of p-taps for use in a folded data path linear-phase FIR structure described in FIG. 8, where the filter structure of FIG. 1(b) is being used.
Figure 9A:
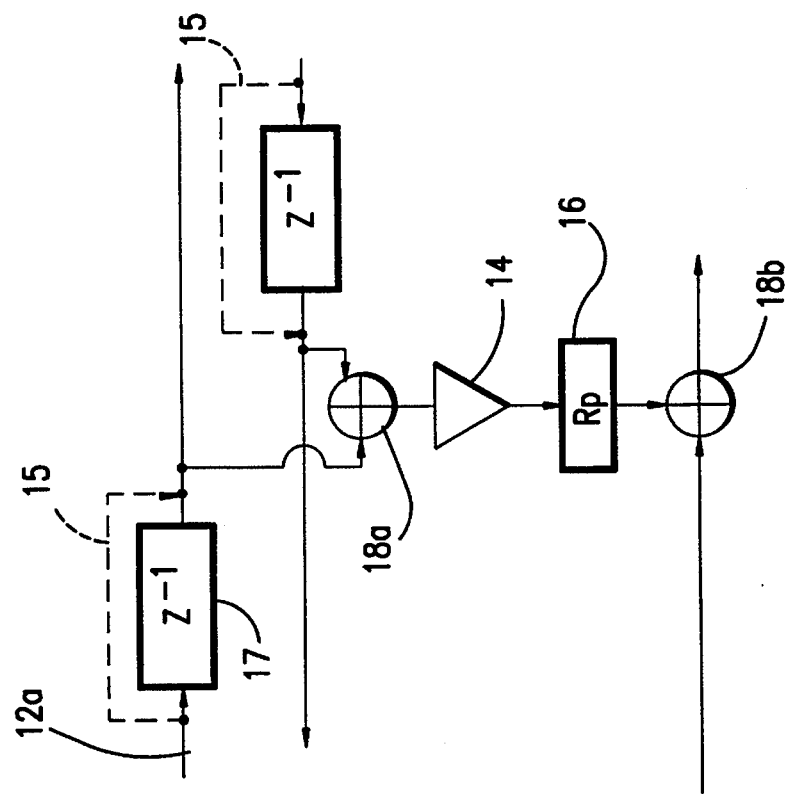
FIG. 9(a) is a block diagram of p-taps for use in a folded data path linear-phase FIR structure described in FIG. 8, where the filter structure of FIG. 1(a) is being used.

For the case of linear phase FIR filters, that is, filters whose filter coefficient array has symmetry about its center point, a more efficient implementation can be achieved using the p-taps shown in FIGS. 9(*a*) and 9(*b*), where the multiply/accumulate elements are shared among two symmetrically positioned taps. This is an embodiment of the well-known folded data path structure for implementing linear phase FIR filters such as in the published UK Patent Application GB 2,104,332 A entitled "Digital finite impulse response filter." Once again, the use of the novel switchable unit-delay allows the optimal allocation of hardware resources.

FIG. 9(*a*) is the folded dual p-tap element for the direct form FIR filter of FIG. 1(*a*), and FIG. 9(*b*) is the folded dual p-tap element for the transposed form FIR filter of FIG. 1(*b*). These folded dual p-taps allow sharing of multipliers 14 among the two p-tap elements spaced evenly from the center point of the filter.

The core of the integrated circuit 100 is an array 110 of thirty-two two-digit p-taps that is preferably folded using sixteen dual p-taps as shown in FIGS. 9(*a*) and 9(*b*) to share the symmetrical coefficients for linear phase operation. The first sixteen p-taps in the array 110 from the input are identical to the p-tap 10 described above in FIG. 3. The last sixteen p-taps lack a coefficient multiplier 14 and share the multiplier with another p-tap in a symmetrical manner. Thus, the first and last p-taps share the same coefficient multiplier, the second and the fifteenth p-taps share the same multiplier, the third and the fourteenth p-taps share the same multiplier, etc.

Further, programmable inverters (PINV) 134 controlled by a symmetry control 135 are coupled to the center point to invert the output of the delay element at the center point. This inversion on each of these data bits performs one's complement inversion so that the filter can implement an antisymmetric filter algorithm simply and efficiently.

Surrounding the array are clock and data drivers 120–129, a vector merge adder (VMA) 130, a programmable compensation vector register (CVR) 132, coefficient registers 136, and testing circuitry comprised of a pseudo random number generator 140 and a decimator 142. The carry and sum outputs from the last p-tap are added using a 20-bit VMA 130 to produce the final output.

The VMA 130 is implemented by a five-stage pipelined carry-ripple adder. The pipelining removes the VMA from the critical path of the filter. The programmable compensation vector register (CVR) 132 is used to correct the filter core output by adding in the MSB sign-extension and the additional one's needed for two's complement negation. This vector compensates for the one's complement negation used in the array 110. It can also be used to select between rounding or truncation. Techniques for calculating a given filter's compensation vector are well known. See, for example, the Master of Science in Electrical Engineering thesis of Joe Laskowski entitled "A Silicon Compiler for Linear Phase FIR Digital Filters," at pages 11 through 19 and 58–59, submitted in 1991 at the University of California, Los Angeles (UCLA).

In the preferred implementation, a controller 102, which may be a microprocessor, works in conjunction with the filter. The compensation vector is programmed through the input data bus by the controller 102 over signal line or lines 133. The controller may also supply the coefficient inputs for the coefficient register, the control signal to load the control register to change the filter algorithm and the pass signals 25 (FIG. 4) over signal line or lines 137. These vectors and coefficients may be stored in a RAM (not shown) that is accessed by the controller.

To facilitate testing of the chip, a pseudo random number generator (PRNG) 140 and an output decimator (DEC) 142 are implemented on the die. The PRNG 140 is based on linear feedback shift registers. The output decimator 142 when not bypassed by the multiplexer 143 decimates the output samples by a factor of sixteen. In the test setup, when testing is performed within the frequency range of a commonly available tester (not shown) having a maximum data sample rate of less than 50 MHz, the output decimator is bypassed by the controller on line 139 coupled to the multiplexer 143. Input test vectors are applied directly by the tester through the multiplexer 146 at the input 148. To perform testing beyond the frequency range of the tester, the clock signal to the chip is supplied by an external high frequency source (not shown), the PRNG 140 is turned on by the test control signal 149 supplied from the tester (not shown), and the output is decimated by the decimator 142 and sampled asynchronously by the tester (not shown). In that situation, the multiplexer 146 also supplies the output of the PRNG 140 to the array 110 and the output decimator control 139 causes the multiplexer 143 to provide the output of the decimator 142 to the tester (not shown). A computer program may be used to correlate the outputs sampled by the tester with the calculated result to verify the chip's functionality at the higher speed. This permits verifying the core of the chip to at least eight times the sampling speed of the tester.

Since the p-tap is small in size, many can be integrated on a single chip enabling the programmable filter 100 to realize longer FIR filters. A prototype circuit has been designed and tested that provides the ability to implement a broad spectrum of linear-phase FIR filters employing up to thirty-two taps with sixteen-bit input and output data and operating at data rates as high as 180 MHz in a die size of 5.9 mm by 3.4 mm using 1.2 micron CMOS technology.

Thus, each of the objects is accomplished. Although the specific embodiment shows the use of a two-digit dual p-tap in a thirty-two p-tap array, it would be understood by those of ordinary skill that the same principles may be applied to larger or smaller numbers of bits and p-taps.

The design enables high-speed processing while avoiding the severe hardware inefficiency that would result from straightforward programmable tap implementations that were reported previously. In a straightforward implementation, many tap "multipliers" would significantly waste valuable computational resources since all taps of a programmable structure would need to accommodate "difficult" coefficient values, while for any specific transfer function, most taps would not require such extreme capabilities. The switchable unit-delay not only allows the programming of the number of taps and the specific tap-coefficient values, it provides the capability for programming the optimal allocation of hardware resources to each tap. Thus, the computational resources that otherwise might have been wasted are made available to further increase the precision in any tap's coefficient representation, or for use in implementing a larger number of filter taps. This capability is critical for the feasible VLSI implementation of long FIR filters and correlators used in high-performance digital signal processing applications. The prototype chip demonstrates the ability to implement a broad spectrum of filtering algorithms, including linear phase FIR filters employing up to thirty-two taps with sixteen-bit input and output data and operating at data rates as high as 180 MHz.

A further advantage of the p-tap structure is that either or both the number of coefficients and the precision of the coefficients may arbitrarily be selected by programming. This allows one to choose between narrow transition bands and high attenuation in the stopband(s). For narrower transition, one wants a larger number of coefficients, while for large stopband attenuation one wants coefficients with more digits of precision.

Still further, it will be understood by those of ordinary skill that other implementations of multipliers, adders, registers, coefficient representation schemes, etc., may be used with the invention than those particularly described. It would also be understood by those of ordinary skill that the basic p-tap structure could be easily modified to include cases of multiple data paths, such as the filtering of "in phase" and "quadrature" (I&Q) data channels by the same filter algorithm. The embodiment can obviously be easily modified for algorithms requiring scalar product or matrix/vector computations by replacing the switchable unit-delay with a switchable open-circuit/closed-circuit unit and providing multiple input paths and output paths for the p-tap array. Resort to the true scope of the invention should be had by resort to the claims.

We claim:

1. A first digital filter tap element having a first predetermined number of digits for part of a filter having a plurality of such tap elements for digitally filtering an input digital signal according to an algorithm based upon a first filter coefficient having a second predetermined number of digits, the first tap element comprising:

a coefficient multiplier having the first number of digits for multiplying at least a part of the input with a coefficient to form a product;

an adder responsive to the product of the multiplier and a second input providing as an output the sum of the product and the second input;

a delay element providing both a delayed and an undelayed signal coupled to one of the inputs to the multiplier or the output of the adder; and means for selecting between the delayed and undelayed signal so that where the second number is greater than the first number, a second such tap element is combined with the first element to multiply the digital signal with the coefficient having the second number of digits.

2. The digital filter delay element of claim 1, wherein a register is coupled between the output of the coefficient multiplier and the input of the adder.

3. The digital filter delay element of claim 1, wherein the second tap element includes:
- a second coefficient multiplier coupled to the input to provide a second product;
- a second adder responsive to the second product of the multiplier and a third input providing as an output the sum of the product and the third input;
- a second delay element responsive to the output of the second adder;
- a second terminal selectively responsive to the output of the second adder and the output of the second delay element, the second terminal being coupled to the second input of the first adder; and
- means for selecting whether the second terminal is responsive to the output of the second adder or the output of the second delay element.

4. The filter element of claim 1, wherein the digits in the coefficient comprises one of a set of negative one and one.

5. The filter element of claim 1, wherein the coefficient multiplier comprises only shifting circuitry.

6. The filter element of claim 1, wherein the coefficient is a canonic signed digit representation.

7. The filter element of claim 6, wherein the coefficient is a canonic signed digit representation comprised only of negative ones and ones.

8. A computational element in a filter having a plurality of such elements for performing a computation on an input with a coefficient of not greater than a predetermined precision comprised of:
- a coefficient multiplier to provide a product comprised of a part of the coefficient and the input;
- an adder providing a sum of a second quantity and the product;
- an output element responsive to the sum comprised of one of a group consisting of a selectively bypassable delay and a selectively controlled single pole single throw switching element such that bypassing the delay increases the precision of the multiplier.

9. A digital signal processor comprising a plurality of computational elements of claim 8, and a register storing a control word, the computational elements being coupled to each other in response to the control word to perform one of scalar product, matrix operations, and filtering operations on the input.

10. A method for digitally filtering a digital input signal with a digital filter algorithm having coefficients, each coefficient having a predetermined number of digits, the method comprising:
- providing a plurality of separate coefficient multipliers, adders, switching elements and delay elements, with the adders and delay elements having inputs and outputs, with at least some of the coefficient multipliers having less than a predetermined precision and with the multipliers providing a product of the input signal and some coefficient digits at an output and the output of each coefficient multiplier being coupled to a switching element selecting between an input to one of the delay elements and to an input of one of the adders;
- for each coefficient having a precision greater than the predetermined number of digits, coupling the multiplier to the input of an adder and the output of the adder to the input of another adder to form a combined coefficient multiplier having a precision greater than the number of digits in each such coefficient.

* * * * *

UNITED STATES PATENT AND TRADEMARK OFFICE
CERTIFICATE OF CORRECTION

PATENT NO. : 5,479,363
DATED : December 26, 1995
INVENTOR(S) : Wilson, Jr. et al.

It is certified that error appears in the above-identified patent and that said Letters Patent is hereby corrected as shown below:

Column 1, line 5 first paragraph, add:
    This invention was made with Government support under Grant No.: MIP-9201104, awarded by the National Science Foundation; Grant No.: N00014-91-J-1852, awarded by the Office of Naval Research. The Government has certain rights in this invention.

Signed and Sealed this

Ninth Day of March, 1999

*Attest:*

Q. TODD DICKINSON

*Attesting Officer*  Acting Commissioner of Patents and Trademarks